United States Patent [19]
Hwang

[11] Patent Number: 5,681,771
[45] Date of Patent: Oct. 28, 1997

[54] METHOD OF MANUFACTURING A LDD TRANSISTOR IN A SEMICONDUCTOR DEVICE

[75] Inventor: Joon Hwang, Chungchongbuk-Do, Rep. of Korea

[73] Assignee: Hyundai Electronics Industries Co., Ltd., Kyungki-Do, Rep. of Korea

[21] Appl. No.: 621,731

[22] Filed: Mar. 21, 1996

[30] Foreign Application Priority Data

Mar. 22, 1995 [KR] Rep. of Korea .................. 95-6092

[51] Int. Cl.$^6$ ................................... H01L 21/265
[52] U.S. Cl. .................. 437/44; 437/45; 437/164
[58] Field of Search ................... 437/44, 45, 164

[56] References Cited

U.S. PATENT DOCUMENTS

| | | | |
|---|---|---|---|
| 5,024,959 | 6/1991 | Pfiester | 437/34 |
| 5,324,686 | 6/1994 | Tsunashima | 437/152 |
| 5,338,698 | 8/1994 | Subbanna | 437/40 |
| 5,340,770 | 8/1994 | Allman et al. | 437/164 |
| 5,434,440 | 7/1995 | Yoshitomi et al. | 257/344 |
| 5,512,502 | 4/1996 | Ootsuka et al. | 437/41 |

*Primary Examiner*—John Niebling
*Assistant Examiner*—Richard A. Booth
*Attorney, Agent, or Firm*—Fish & Richardson, P.C.

[57] ABSTRACT

This invention relates to a method of manufacturing a transistor which can form a junction having shallow junction depth and accomplish high trans conductance by forming a N$^+$ region on a silicon substrate to suppress short channel effect and forming a P$^{--}$ layer on the N$^+$ region using a boron silicate glass layer(BSG) in manufacturing a p-type transistor.

3 Claims, 2 Drawing Sheets

METHOD OF MANUFACTURING A LDD TRANSISTOR IN A SEMICONDUCTOR DEVICE

FIELD OF THE INVENTION

This invention relates to a method of manufacturing a transistor in a semiconductor device, and more particularly to a method of manufacturing a transistor which can form a junction having shallow Junction depth and accomplish high trans-conductance by forming a $N^+$ region on a silicon substrate to suppress short channel effect and forming a $P^{--}$ layer on the $N^+$ region using a boron silicate glass(BSG) layer in manufacturing a P-type transistor.

BACKGROUND OF THE INVENTION

Generally, in manufacturing a C-MOS transistor having a N-MOS type transistor and a P-type transistor, the P-type transistor has a shortcoming in the light of short channel effect as compared with the N-type transistor. A conventional method of manufacturing a transistor in a semiconductor device will be described with reference to FIG. 1A and FIG. 1B, below.

Referring to FIG. 1A, a gate oxide layer 3 and a polysilicon layer are sequentially formed on a silicon substrate 1 having a N-well 2. An impurity ion is implanted to the polysilicon layer, and the polysilicon layer and the gate oxide layer 3 are sequentially patterned by an etching process using a gate electrode mask, thereby forming a gate electrode 4. A LDD(Lightly Doped Drain) region 5 is formed in the silicon substrate 1 by injecting a LDD ion therein.

FIG. 1B is a sectional-view illustrating the formation of an oxide spacer 4 which is formed on both side wall of the gate electrode 6 and the formation of a junction region 7 in the silicon substrate 1 by injecting a high concentration impurity ion.

In the above process, if a $N^+$-impurity ion is injected within the polysilicon layer, a $N^+$ poly gate same as that of a N-type MOS transistor is obtained. Hence, it is profitable in the light of manufacturing cost, but unprofitable in the light of short channel effect. Also, if a $P^+$-impurity ion such as boron(B) is injected within the polysilicon layer, the boron ion is penetrate into the silicon substrate 1 through the gate oxide layer 3, thereby lowering the trans conductance.

SUMMARY OF THE INVENTION

Therefore, it is an object of this invention to provide a method of manufacturing a transistor in a semiconductor device which can solve the above defects by forming a $N^+$ region within a silicon substrate and forming a $P^{--}$ layer on the $N^+$ region using a BSG layer.

To accomplish the above object, a method of manufacturing a transistor in a semiconductor device according to a first embodiment of the invention, comprising the steps of:

a method of manufacturing a transistor in a semiconductor device, comprising the steps of:

growing an oxide layer on a silicon substrate having N-well;

forming a $N^+$ region within said silicon substrate;

removing said oxide layer and forming a first BSG layer on the resulting structure after removing said oxide layer;

forming a $P^{--}$ layer on said $N^+$ region;

removing said first BSG layer and sequentially forming a gate oxide layer and a polysilicon layer on the resulting structure after removing said first BSG layer;

implanting a $P^+$ impurity ion into said polysilicon layer and sequentially patterning said polysilicon layer and said oxide layer, thereby forming a gate electrode;

forming a spacer on the both side wall of said gate electrode;

depositing a second BSG layer on the resulting structure after forming said spacers;

implanting a $P^+$ impurity ion into said silicon substrate, thereby forming a junction region;

performing a rapid thermal annealing process; and removing said second BSG layer.

A method of manufacturing a transistor in a semiconductor device according to a second embodiment of the invention, comprising the steps of:

growing an oxide layer on a silicon substrate and forming a N-well in said silicon substrate;

removing said oxide layer and forming a BSG layer on the resulting structure after removing said oxide layer;

forming a $P^{--}$ layer on said N-well removing said BSG layer and sequentially forming a gate oxide layer and a polysilicon layer on the resulting structure after removing said BSG layer;

implanting $P^+$ impurity ion into said polysilicon layer and said gate oxide layer, thereby forming a gate electrode;

forming an oxide spacer on the both side wall of said gate electrode; and implanting $P^+$ impurity ion into said silicon substrate, thereby forming a junction region.

BRIEF DESCRIPTION OF THE DRAWINGS

For fuller understanding of the nature and objects of the invention, reference should be made to the following detailed description and the accompanying drawings in which.

Similar reference characters refer to similar parts in the several views of the drawings.

DETAILED DESCRIPTION OF THE INVENTION

FIG. 2A through FIG. 2E are cross-sectional views for explaining a first embodiment of the present invention.

Figure 1A:
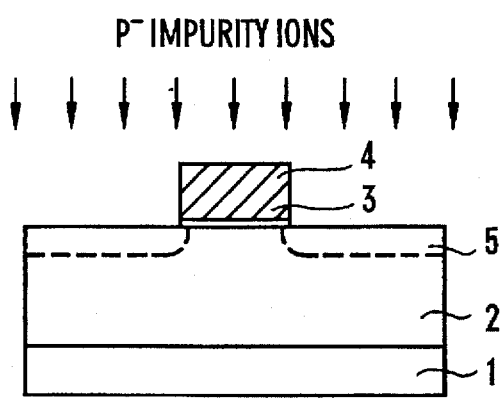
FIGS. 1A and 1B are cross-sectional views for explaining a conventional method of manufacturing a transistor in a semiconductor device.
Figure 1B:
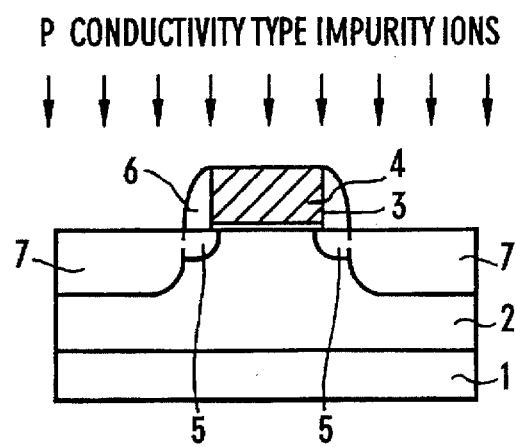
Figure 2A:
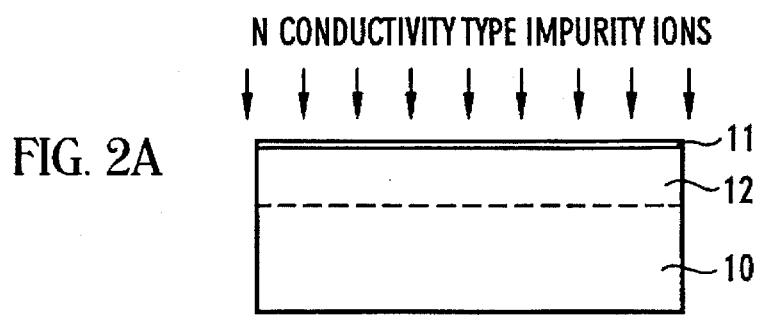
FIG. 2A through FIG. 2E are cross-sectional views for explaining a method of manufacturing a transistor in a semiconductor device according to a first embodiment of the present invention.
Figure 2B:
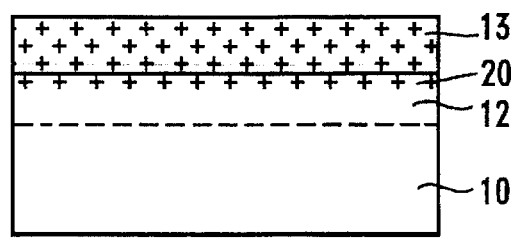

Referring to FIG. 2A, an oxide layer 11 is grown on a silicon substrate 10 having a N-well (not shown) and a $N^+$ region 12 is then formed in the silicon substrate 10 by injecting a $N^+$ impurity ion, and thereafter performing heat treatment. Impurity concentration of the $N^+$ region is higher than that of the N-well, With reference to FIG. 2B, the oxide layer 11 is removed and a first BSG layer 13 is then deposited on the resulting structure after removing the oxide layer 11. A $P^{--}$ layer 20 is formed on the $N^+$ region 12 by performing a rapid thermal annealing process, wherein the $P^{--}$ layer 20 is formed by diffusion of $P^{--}$ ion from the first BSG layer 13 during the rapid thermal annealing process.

Figure 2C:
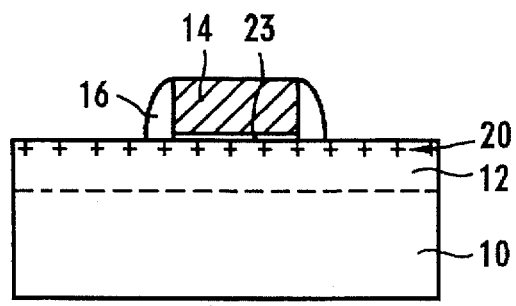

Referring to FIG. 2C, the BSG layer 13 is removed and a gate oxide layer 23 and a polysilicon layer are then sequentially formed on the resulting structure after removing the BSG layer 13. A P$^+$ impurity ion is implanted within the polysilicon layer and a gate electrode 14 is then formed by sequentially patterning the polysilicon layer and the gate oxide layer 23 using a gate electrode mask. An oxide spacer 16 is formed on the both side wall of the gate electrode 14.

Figure 2D:
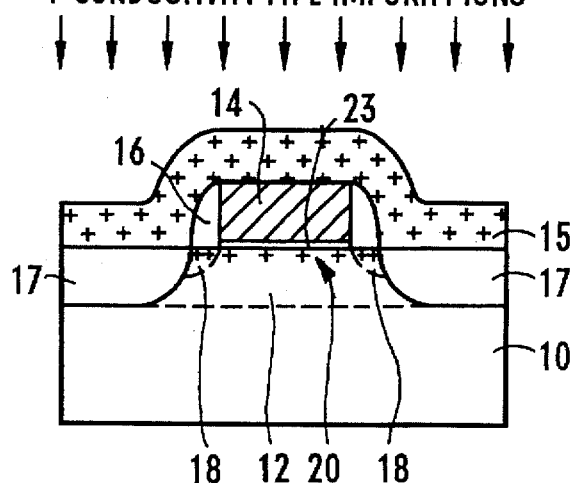

Referring to FIG. 2D, the second BSG layer is deposited on the resulting structure after forming the oxide spacer 16 and a rapid thermal annealing process is then performed. By such a process, boron in the P$^-$ layer 20 is laterally diffused, thereby forming a p region 18 within the silicon substrate 10 under the oxide spacer 16. However, boron in the gate electrode 14 is not penetrated into the silicon substrate 10 due the P$^-$ layer 20.

Figure 2E:
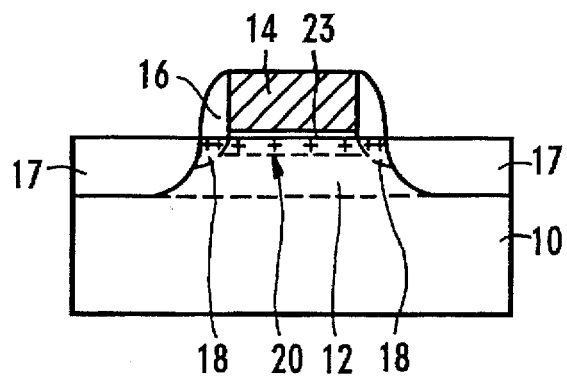

Referring to FIG. 2E, the second BSG layer 15 is removed, thereby completing a P-type MOS transistor.

Figure 3A:
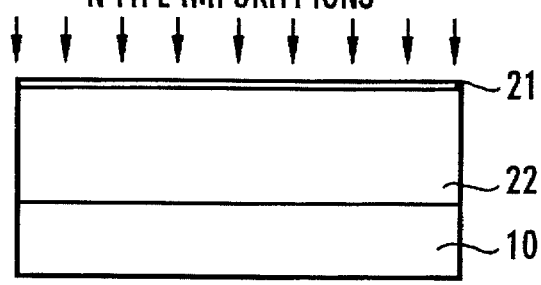
FIG. 3A through 3C are cross-sectional views for explaining a second embodiment of the present invention.
Figure 3B:
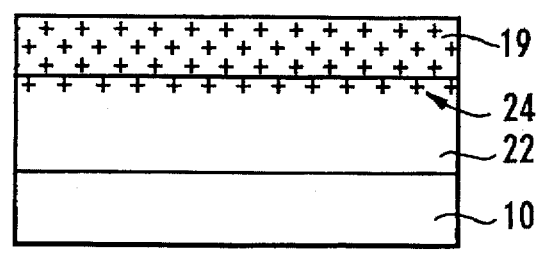
Figure 3C:

FIG. 3A through FIG. 3C are cross-sectional views for explaining a second embodiment of the invention.

Referring to FIG. 3A, an oxide layer 21 is grown on a silicon substrate 10 and N-type impurity ion is then implanted. A drive-in process is performed, thereby forming a N-well 22 in the silicon substrate 10.

Referring to FIG. 3B, the oxide layer 21 is removed and a BSG layer 19 is then deposited on the resulting structure after removing the oxide layer 21. A P$^-$ layer 24 is formed on the N-well 22 by performing a rapid thermal annealing process, where the P$^-$ layer 24 is formed by diffusion of P$^-$ ion from the BSG layer 19 during the rapid thermal annealing process.

Referring to FIG. 3C, the BSG layer 19 is removed and a gate oxide layer 33 and a polysilicon layer are sequentially formed on the resulting structure after removing the BSG layer 19. A P$^+$ impurity ion is implanted within the polysilicon layer and a gate electrode 34 is then formed by sequentially patterning the polysilicon layer and the gate oxide layer using a gate electrode mask an oxide spacer 26 is formed on the both side wall of the gate electrode 34 and a junction region 27 is then formed by implanting P$^-$ impurity ion into the silicon substrate 10. A rapid thermal annealing process is performed after forming the junction region 27, wherein boron in the P$^-$-layer 24 is laterally diffused, thereby forming a P$^-$ region 28 within the silicon substrate 10 under the oxide spacer 26. However, boron in the gate electrode 34 is not penetrated into the silicon substrate 10 due to the P$^-$-layer 24.

As describe above, according to the present invention, it is possible to form a Junction region having a shallow junction depth by forming a N$^+$ region within a silicon substrate and forming a P$^-$ layer on the N$^+$ region using a BSG layer. Also, it is possible to effectively suppress the short channel effect and to obtain high trans conductance.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a transistor in a semiconductor device, comprising the steps of:

growing an oxide layer on a silicon substrate having an N-well having a first doping concentration;

forming a N$^+$ region within said silicon substrate having a higher doping concentration than said first doping concentration of said N-well;

removing said oxide layer and forming a first BSG layer on a resulting structure after removing said oxide layer;

forming a P$^-$ layer on said N$^+$ region;

removing said first BSG layer and sequentially forming a gate oxide layer and a polysilicon layer on a resulting structure after removing said first BSG layer;

implanting P conductivity type impurity ions into said polysilicon layer and sequentially patterning said polysilicon layer and said oxide layer, thereby forming a gate electrode;

forming spacers on opposing side walls of said gate electrode;

depositing a second BSG layer on a resulting structure after forming said spacers;

implanting P conductivity type impurity ions into said silicon substrate, thereby forming a P$^+$ junction region;

performing a rapid thermal annealing process; and removing said second BSG layer.

2. The method of claim 1, wherein said N$^+$ region is formed by implanting N conductivity type impurity ions and performing a heat treatment.

3. The method of claim 1, wherein said P$^-$ layer is formed by rapidly annealing said first BSG layer.

* * * * *